United States Patent [19]

Yum

[11] Patent Number: 5,053,640

[45] Date of Patent: Oct. 1, 1991

[54] BANDGAP VOLTAGE REFERENCE CIRCUIT

[75] Inventor: Daniel Yum, Poway, Calif.

[73] Assignee: Silicon General, Inc., Garden Grove, Calif.

[21] Appl. No.: 427,173

[22] Filed: Oct. 25, 1989

[51] Int. Cl.[5] .......................... H03K 3/01; H03K 3/26

[52] U.S. Cl. ................................ 307/296.6; 307/310; 323/313; 323/314

[58] Field of Search ............... 323/313, 314, 315, 907; 307/296.6, 475, 443, 310

[56] References Cited

U.S. PATENT DOCUMENTS

| | | | |
|---|---|---|---|
| 4,453,037 | 6/1984 | Terry | 323/315 |
| 4,620,115 | 10/1986 | Lee et al. | 307/443 |
| 4,626,770 | 12/1986 | Price | 323/313 |
| 4,644,257 | 2/1987 | Bohme et al. | 323/313 |
| 4,797,577 | 1/1989 | Hing | 307/296.6 |
| 4,808,908 | 2/1989 | Lewis et al. | 323/313 |

OTHER PUBLICATIONS

R. J. Widlar "New Developments in IC Voltage Regulators," IEEE Journal of Solid State Circuits, vol. SC-6, Feb. 1971.

A. P. Brokaw "A Simple Three-Terminal IC Bandgap Reference," IEEE Journal of Solid State Circuits, vol. SC-9, No. 6, Dec. 1974.

G. C. M. Meijer, et al. "A New Curvature-Corrected Bandgap Reference," IEEE Journal of Solid State Circuits, vol. SC-17, No. 6, Dec. 1982.

R. A. Pease, "A Fahrenheit Temperature Sensor," 1984 IEEE International Solid State Circuits Conference.

*Primary Examiner*—Stanley D. Miller
*Assistant Examiner*—Richard Roseen
*Attorney, Agent, or Firm*—Spensley Horn Jubas & Lubitz

[57] ABSTRACT

A voltage reference circuit employs a bandgap cell to establish a voltage reference, stabilized relative to the bandgap voltage of silicon, and a compensation circuit for compensating non-linear temperature dependence of the bandgap stabilized voltage reference. A two or three transistor type bandgap cell may be employed to establish the bandgap reference voltage along with a voltage divider network to adjust the output reference voltage relative to the bandgap voltage of silicon. The compensation circuit preferably employs a compensation resistor in the resistor divider network, and a switching circuit for switching current therethrough. This provides empirically determined adjustments to the output reference voltage by switching current through the compensation resistor in accordance with predetermined temperature thresholds.

20 Claims, 6 Drawing Sheets

BANDGAP VOLTAGE REFERENCE CIRCUIT

BACKGROUND OF THE INVENTION

1. Field of the Invention

The present invention relates to analog and digital circuits. In particular, the present invention relates to voltage reference circuits for providing stable reference voltages for analog and digital applications.

2. Background of the Prior Art and Related Information

In electronic design, stable voltage references are needed for a wide variety of analog and digital applications. Such applications include voltage regulators, current supplies for ECL logic, etc. For lower voltages, however, and also where stability over a large temperature range is required, providing a precision reference voltage poses considerable problems. In particular, a voltage reference having good stability over a wide temperature range, such as the standard military specification temperature range of −55° C. to +125° C., is very difficult to achieve in a commercially practical implementation.

One conventional approach to providing a voltage reference has been to use temperature compensated zener diodes. Since the breakdown voltage of a zener diode is about 6 volts, however, this provides a lower limit on the input voltage employed in a voltage regulator circuit. Other disadvantages are also associated with zener diode voltage references, such as stability problems, process control problems and noise introduced into the circuit.

In another approach, the bandgap voltage of silicon is employed as an internal reference to provide a regulated output voltage. This approach overcomes many of the limitations of zener diode voltage references such as long-term stability errors and incompatibility with low voltage supplies. One such conventional bandgap voltage reference is disclosed in R. Widlar, New Developments in IC Voltage Regulators, IEEE J. Solid-State Circuits, Vol. SC-6 (February 1971), and is illustrated generally in FIG. 1. In this approach, a relatively stable voltage is established by adding together two scaled voltages having positive and negative temperature coefficients, respectively. The positive temperature coefficient is provided by the difference between the base-emitter voltages of two bipolar transistors Q1 and Q2 operating at different emitter current densities (referring to FIG. 1). Since these two transistors are operated at different current densities, a differential in the emitter-base voltages of the two devices is created and appears across R3. The negative temperature coefficient is that of the base-emitter junction of transistor Q3. Thus the basic bandgap cell requires three transistors, Q1, Q2 and Q3 to achieve the offsetting temperature coefficients. It can be shown that, for theoretically perfect device operation, if the sum of the initial base-emitter voltage of Q1 and the base-emitter voltage differential of the two transistors Q1 and Q2 is made equal to the extrapolated energy bandgap voltage, which is +1.205 V for silicon at T=0° K., then the resultant temperature coefficient equals zero. (The detailed derivation of this result may be found in the above-noted Widlar reference.)

Another example of a bandgap voltage reference is described in A.P. Brokaw, A Single Three-Terminal IC Bandgap Reference, IEEE J. Solid-State Circuits, Vol. SC-9, No. 6 (December 1974). This type of bandgap voltage reference circuit is illustrated generally in FIG. 2. This circuit employs a variation of the Widlar bandgap reference circuit, wherein two reference transistors Q1 and Q2 are implemented with a collector-current sensing amplifier A to establish the bandgap voltage. The emitter current densities of Q1 and Q2 are adjusted by varying their relative size. Amplifier A, in conjunction with the collector load resistors, senses the collector currents of the reference transistors and forces them to be equal. Alternatively, a current mirror configuration is employed to sense the collector currents of Q1 and Q2. By adjusting R1 and R2 the differential base-emitter voltage of Q1 and Q2 can be used to provide a positive temperature coefficient term which compensates the negative temperature coefficient of the base-emitter voltage of Q1. This compensated voltage appears as $V_{OUT}$.

These above-described bandgap voltage references, using two or three-transistor bandgap cells, allow operation with very low voltage sources, as compared to the earlier 6 V limitation of avalanche diodes, as well as providing greater stability.

Although these conventional bandgap voltage references provide several advantages for voltage reference design, for practical non-ideal bipolar transistors, perfect temperature compensation is not provided. For both the above-mentioned conventional bandgap voltage reference circuits, the actual temperature characteristic is a parabolic temperature curve due to nonlinearities of the temperature behavior of the transistors forming the bandgap cell, as well as to nonlinearity of the circuit resistance temperature coefficient. Such a parabolic temperature dependent curve is illustrated in FIG. 3 for the standard military specification temperature range of −55° C. to +125° C. As shown in FIG. 3, the bandgap-stabilized reference voltage gradually decreases both above and below the nominal compensation temperature (typically room temperature) thereby causing a parabolic temperature curve. This curvature puts a limit on the achievable accuracy of the reference voltage over the desired operating range in conventional bandgap references. Thus, even though the voltage at room temperature can be trimmed to accuracies within approximately 0.5%, over the typical −55° C. to +125° C. temperature range, the curvature of the temperature coefficient of the base-emitter reference voltage limits accuracy to approximately 2% for production quantities.

One approach to compensating for such temperature variations in bandgap voltage references is described in G. Meijer, P. Schmale, and K. Van Zalinge, A New Curvature-Corrected Bandgap Reference, IEEE J. Solid-State Circuits, Vol. SC-17, No. 6 (December 1982). The Meijer et al. article deals with compensation for the thermal nonlinearity of the base-emitter voltage. The article discusses thermal compensation by adding together the correction voltage that is proportional to the absolute temperature squared with the same voltage that is not squared, theoretically providing correction in curvature of the temperature characteristic of the bandgap voltage reference. While in theory, such an approach to compensation may be used, for practical applications, such corrections are extremely difficult to implement. In particular, it is difficult to trim the circuit since all of the temperature coefficients must be extremely precise or else the temperature characteristic of the reference circuit could have even greater nonlinearity. More specifically, a lack of reproducibility arises due to the additional voltage trimming required by adding the squared voltage constant. Additionally, a large number of transistors is necessary to implement the curvature-corrected reference discussed by Meijer et al. Furthermore, only the base-emitter voltage is compensated and the temperature coefficient of the circuit resistance is improperly disregarded, since this resistance value also determines the reference voltage curvature.

Accordingly, a need presently exists for a voltage reference circuit having high precision over a wide temperature range, such as the mil. spec. range −55° C. to +125° C., which may be implemented in a manner readily achieved for production quantities.

SUMMARY OF THE INVENTION the present invention provides a bandgap voltage reference having improved temperature stability over a wide temperature range. The present invention further provides an improved bandgap reference which may be readily implemented in production quantities.

In the present invention, a bandgap reference cell is employed to receive an unregulated input voltage and establish a reference voltage based on the bandgap voltage of silicon. The bandgap cell may be a two or three-transistor cell which combines a positive and a negative temperature coefficient voltage term to establish the reference voltage. A resistor divider network allows the reference voltage to be chosen to have a desired value relative to the silicon bandgap voltage. A temperature compensated reference voltage is provided by compensation circuitry which modulates the divider voltage as a function of temperature. In a preferred embodiment, a compensation resistor in the resistor divider network is employed along with a switching circuit to switch compensation current into the resistor divider network. By switching current through this compensation resistor, the voltage drop of the resistor divider network, and hence the drive voltage applied to the bandgap cell, is adjusted.

The switching circuit receives a voltage from a node in the circuit proportional to absolute temperature to sense temperature variations. Current is switched through the resistor divider network when the temperature of the circuit, as sensed by the voltage at this node, deviates from a nominal temperature. Empirically-selected high or low-temperature switching thresholds in the switching circuit are set, along with the value of the compensation resistor, to determine the amount the voltage will be raised to reduce the error of the reference voltage. In a preferred embodiment, the switching circuit will gradually open or close within a nominal temperature range. Therefore, the transition of the reference voltage will be relatively smooth, resulting in a substantially linear temperature characteristic.

In a preferred embodiment of the present invention, the switching circuit employs separate high and low-temperature current legs. Each current leg employs a differential amplifier. The differential amplifiers open or close to provide current flow when a temperature-dependent voltage exceeds a threshold bias value. An empirically determined threshold, separately set for each leg, controls the compensation current which is switched through the current leg and through the compensation resistor as a function of temperature. This, in turn, corrects for the curvature of the output reference voltage temperature characteristic. Since this correction is empirically determined, it corrects for both the base-emitter voltage temperature coefficient and the nonlinear temperature coefficient of the resistance components of the circuit.

Accordingly, the present invention provides an improved bandgap reference wherein the actual variation of the reference voltage relative to temperature may be reduced to only a few millivolts. The present invention thereby eliminates non-uniformity of the reference voltage and corrects for curvature in the temperature characteristic which is caused by the nonlinear temperature coefficient of a basic bandgap voltage reference.

DETAILED DESCRIPTION OF THE INVENTION

Figure 1:
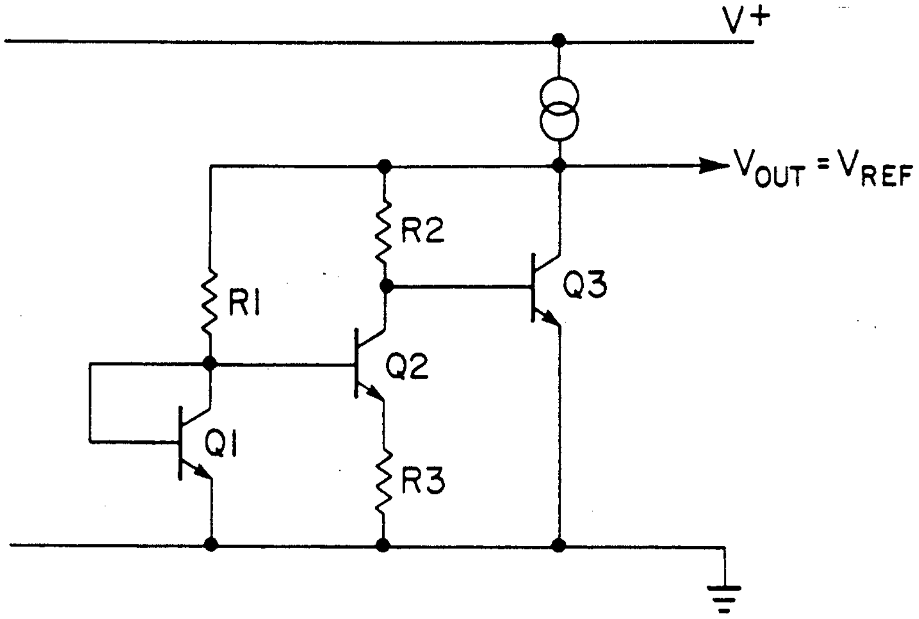
FIG. 1 PRIOR ART
FIG. 1 is a schematic diagram showing a prior art bandgap voltage reference circuit.
Figure 2:
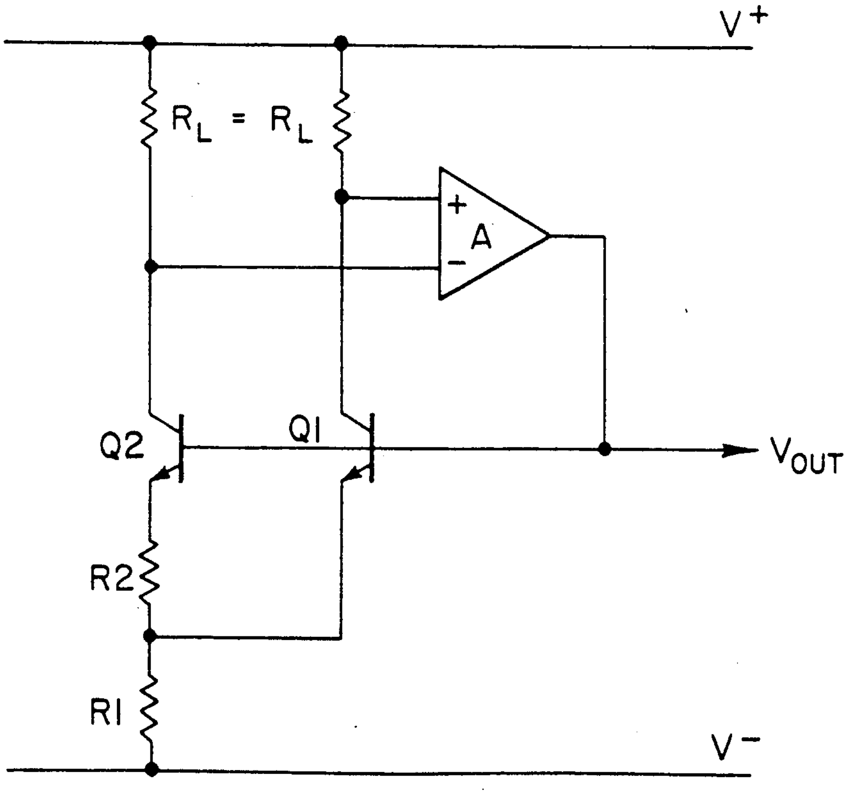
FIG. 2 PRIOR ART
FIG. 2 is a schematic diagram showing another prior art bandgap voltage reference circuit.
Figure 3:
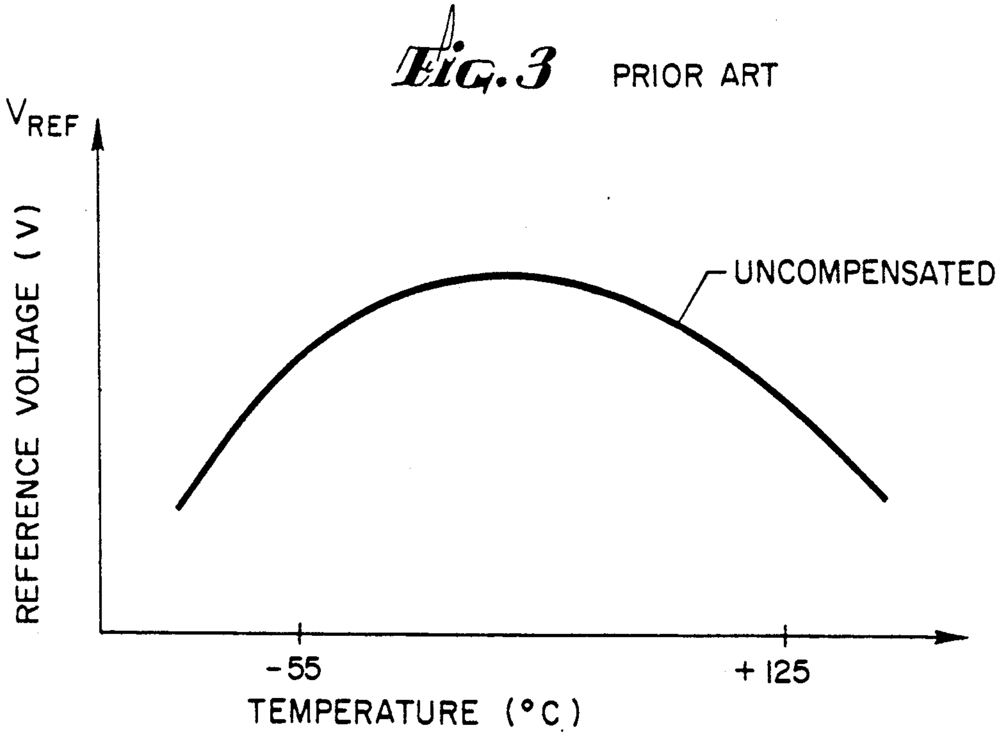
FIG. 3 PRIOR ART
FIG. 3 is a graphical representation of the typical temperature characteristics of a conventional bandgap voltage reference.
Figure 4:
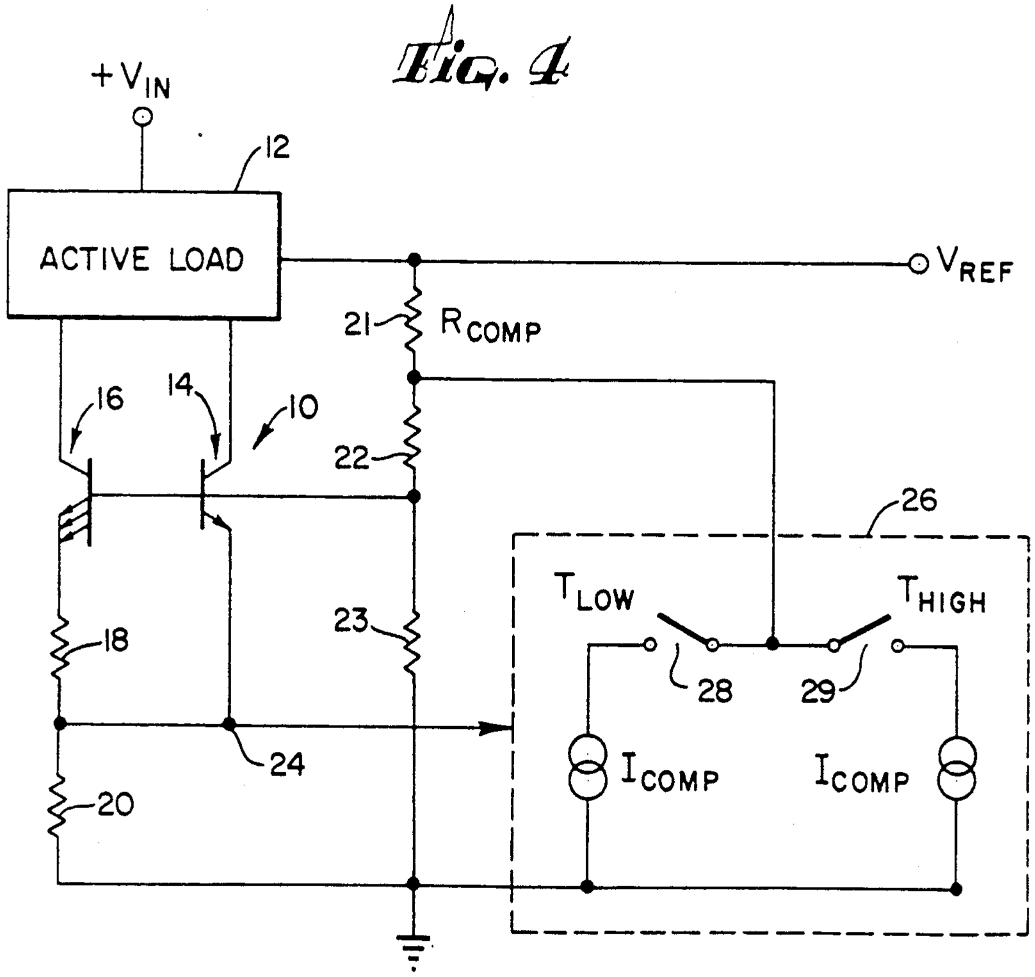
FIG. 4 is a schematic diagram showing a preferred embodiment of the bandgap voltage reference circuit of the present invention.

Referring to FIG. 4, a preferred embodiment of the bandgap voltage reference circuit of the present invention is shown in schematic form. An input voltage $V_{in}$ is supplied to a two-transistor-type bandgap cell 10, and to an active load 12 which acts as a collector current supply and sensing circuit. The circuit output is the desired output reference voltage $V_{REF}$. The specific value of $V_{REF}$ will depend on the desired application, and will be determined by $V_{IN}$ in combination with the other circuit parameters discussed in more detail below. For example, common values of $V_{REF}$ for many digital and analog applications are in the range of 2 to 10 volts.

As shown in FIG. 4, the bandgap cell 10 is a two-transistor-type bandgap cell which includes transistors 14 and 16 having their bases tied together. The emitter current density of transistor 14 is higher than that of transistor 16 to establish a positive temperature coefficient voltage drop across resistor 18 in a manner similar to conventional two-transistor bandgap cells. The difference in emitter current densities is illustrated schematically in FIG. 4 by transistor 16 having a multiple emitter configuration. The active load circuit 12 maintains matching currents through transistors 14 and 16 so that the current densities are maintained in a fixed ratio. This difference causes a difference in base emitter voltage between transistors 14 and 16 to be established across resistor 18. The voltage across resistor 20 is then proportional to absolute temperature, and thus provides a positive temperature coefficient. This offsets the negative coefficient of the base emitter voltage of transistor 14 if the bandgap voltage of silicon is applied to the base of the transistor 14. The output reference voltage $V_{REF}$ need not be the bandgap voltage, however, and may be adjusted by a resistor divider network to a desired larger value while maintaining the bandgap voltage at the base of transistor 14. More specifically, $V_{REF}$ is divided down through a voltage-setting resistor divider network made up of resistors 21, 22, and 23 to cause the extrapolated energy bandgap voltage of the semiconductor material, which is +1.205 V for silicon, to appear at the common base connection of the bandgap cell transistors 14 and 16. This thus achieves bandgap-stabilized temperature compensation of $V_{REF}$ over a nominal temperature range.

Still referring to FIG. 4, switching circuit 26 switches compensation current $I_{COMP}$ into the voltage-setting resistor divider network through compensation resistor 21 to offset the parabolic temperature dependence of bandgap-stabilized $V_{REF}$. The compensation resistor 21 provides a voltage drop across its resistance which varies with the amount of compensation current provided therethrough by switching circuit 26. Switches 28 and 29 are implemented to switch at a temperature outside the nominally stable temperature range, i.e., at temperatures, $T_{LOW}$ and $T_{HIGH}$, respectively. These high and low temperatures, $T_{LOW}$ and $T_{HIGH}$ are empirically determined by the temperatures at which the output voltage $V_{REF}$ deviates more than a desired amount from nominal, e.g., more than 1–2%. Predetermined temperature switching thresholds may be selected so that only the output reference voltage at extreme ends of the temperature range may be compensated. Temperature sense node 24 provides a voltage to circuit 26 which is proportional to absolute temperature, and which is used to control switches 28 and 29.

Figure 5A:
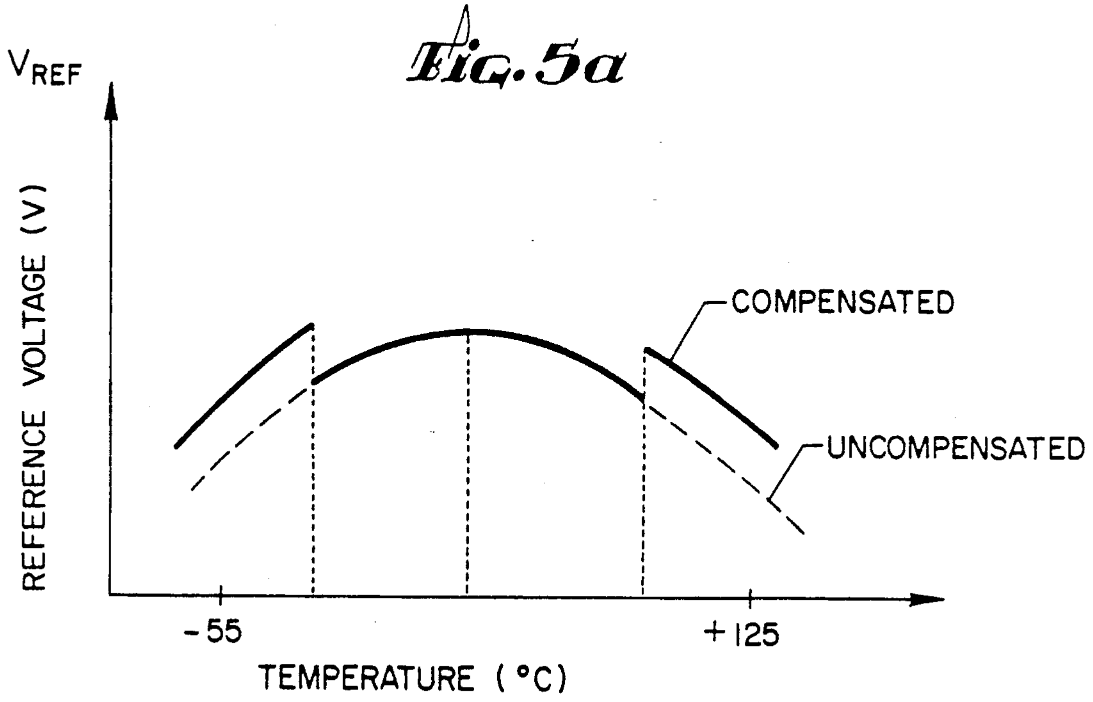
FIG. 5*a* is a graphical representation of the stepwise compensated temperature characteristic provided by the present invention.

Referring to FIG. 5*a* the corrected $V_{REF}$ output of the circuit of FIG. 4 is illustrated qualitatively. By empirically selecting the parameters $R_{COMP}$, $I_{COMP}$ and the temperature switching thresholds $T_{HIGH}$ and $T_{LOW}$, the typical parabolic temperature characteristic (shown by the dashed portion of the curve) can be stepwise corrected by level-shifting shifting $V_{REF}$ by a switching action. At the switching temperatures $T_{LOW}$ and $T_{HIGH}$, the voltage is adjusted to a value slightly higher than the desired room temperature value. At the extreme ends of the temperature range from −55° C. to +125° C., the compensated reference voltage will deviate somewhat from nominal but will be significantly more accurate than the uncompensated value. Therefore, the maximum deviation of the reference voltage over the temperature range is reduced, as shown in FIG. 5*a*.

Figure 5B:
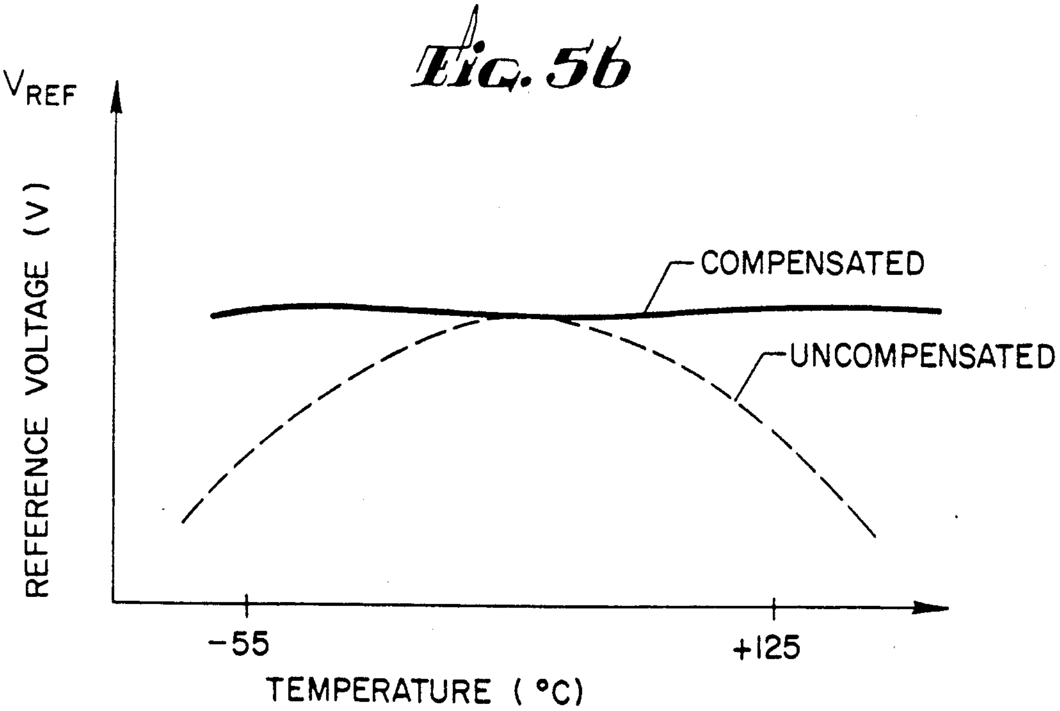
FIG. 5*b* is a graphical representation of a smooth, relatively flat temperature characteristic provided by a preferred embodiment of the present invention.

Referring to FIG. 5*b*, the temperature characteristic of a preferred alternate embodiment of the present invention is shown. In a preferred embodiment described in more detail below, the high and low temperature compensation switches 28 and 29 are not on/off switches but rater are gradually opened and closed with the temperature variation. Thus, the stepwise shifting of FIG. 5*a* is smoothed out, resulting in less abrupt reference voltage transitions. A variation of less than a few millivolts in the output reference voltage $V_{REF}$, may thus be achieved across the entire temperature range of −55° C. to +125° C. Thus, the resulting temperature characteristic is no longer parabolic, but is essentially linear and horizontal as illustrated in FIG. 5*b*.

Figure 6:
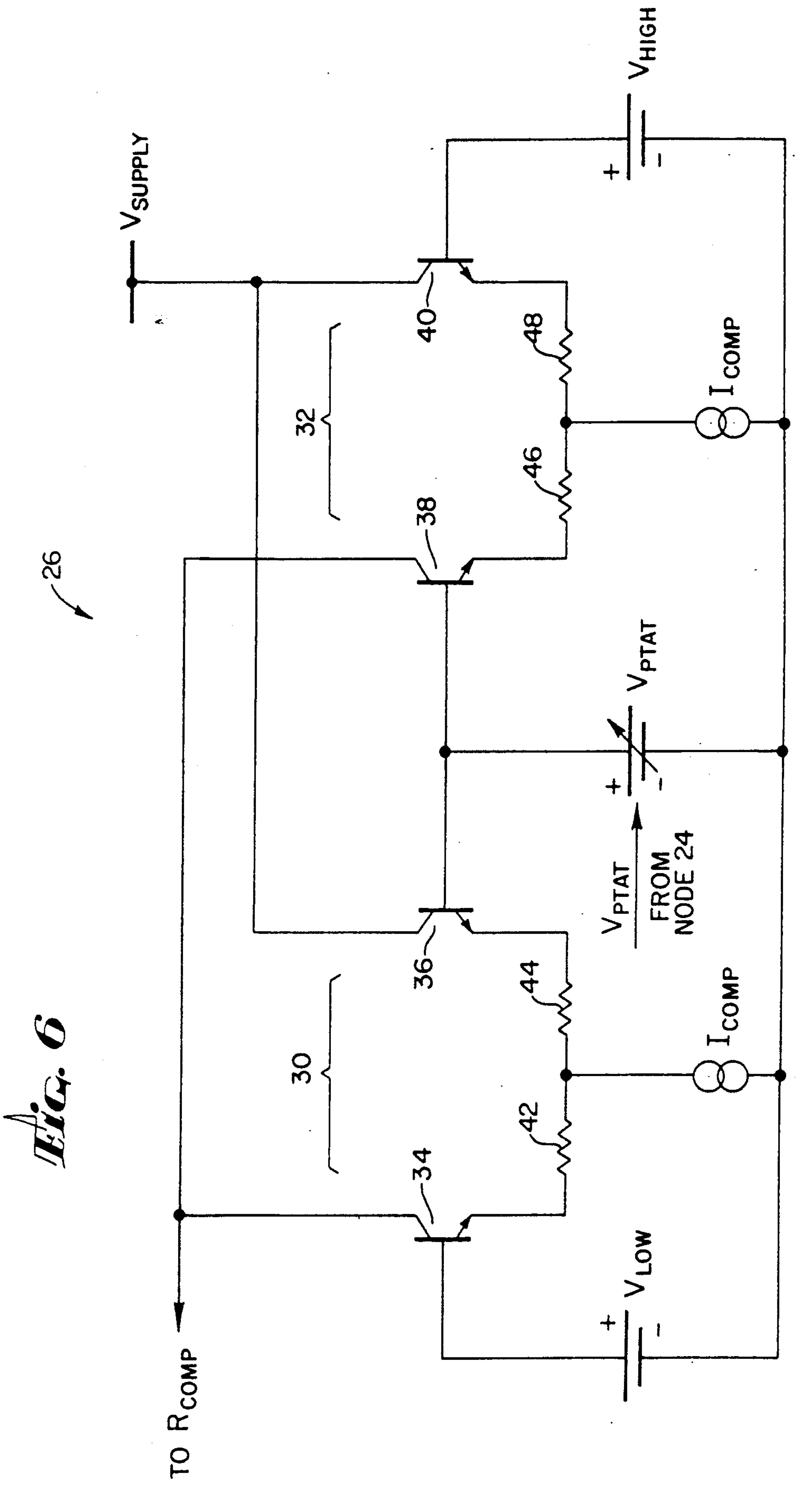
FIG. 6 is a schematic drawing of a preferred embodiment of the switching circuit implemented in the present invention.

FIG. 6 is a schematic diagram of one embodiment of the switching circuit 26 according to the present invention. Two differential amplifiers 30 and 32 are used to switch compensation current $I_{COMP}$ into the compensation resistor 21 (shown in FIG. 4) at high and low temperatures. Each differential amplifier is made up of two transistors; transistors 34 and 36 for low-temperature compensation and transistors 38 and 40 for high-temperature compensation. Resistors 42, 44, 46 and 48 are used for emitter-degeneration and control the switch transconductance, thereby linearizing the switching action. The percentage of compensation current $I_{COMP}$ switched into the compensation resistor is preferably variable with the amount of deviation from room temperature, which action is achieved by the varying drive voltage supplied to transistors 36 and 38. This is provided by coupling the bases of transistors 36 and 38, to temperature sense node 24 (shown in FIG. 4). As discussed above, the voltage at the temperature sense node 24 is proportional to absolute temperature ($V_{PTAT}$). The second input of each switch 30, 32 is connected to a low and high-temperature reference voltage, $T_{LOW}$ and $T_{HIGH}$, respectively, which determines the threshold temperature at which $I_{COMP}$ of each differential amplifier is halfway switched into $R_{COMP}$, thereby compensating the output reference voltage. The voltage $V_{PTAT}$ applied to transistors 36 and 38 is preferably level-shifted up to the bases of these transistors so the compensation current sources $I_{COMP}$ do not saturate. Since the voltage at the temperature sense node $V_{PTAT}$ has a positive temperature coefficient, the temperature reference voltage $V_{HIGH}$ will be higher, and thus more positive, than temperature reference voltage $V_{LOW}$.

Figure 7:
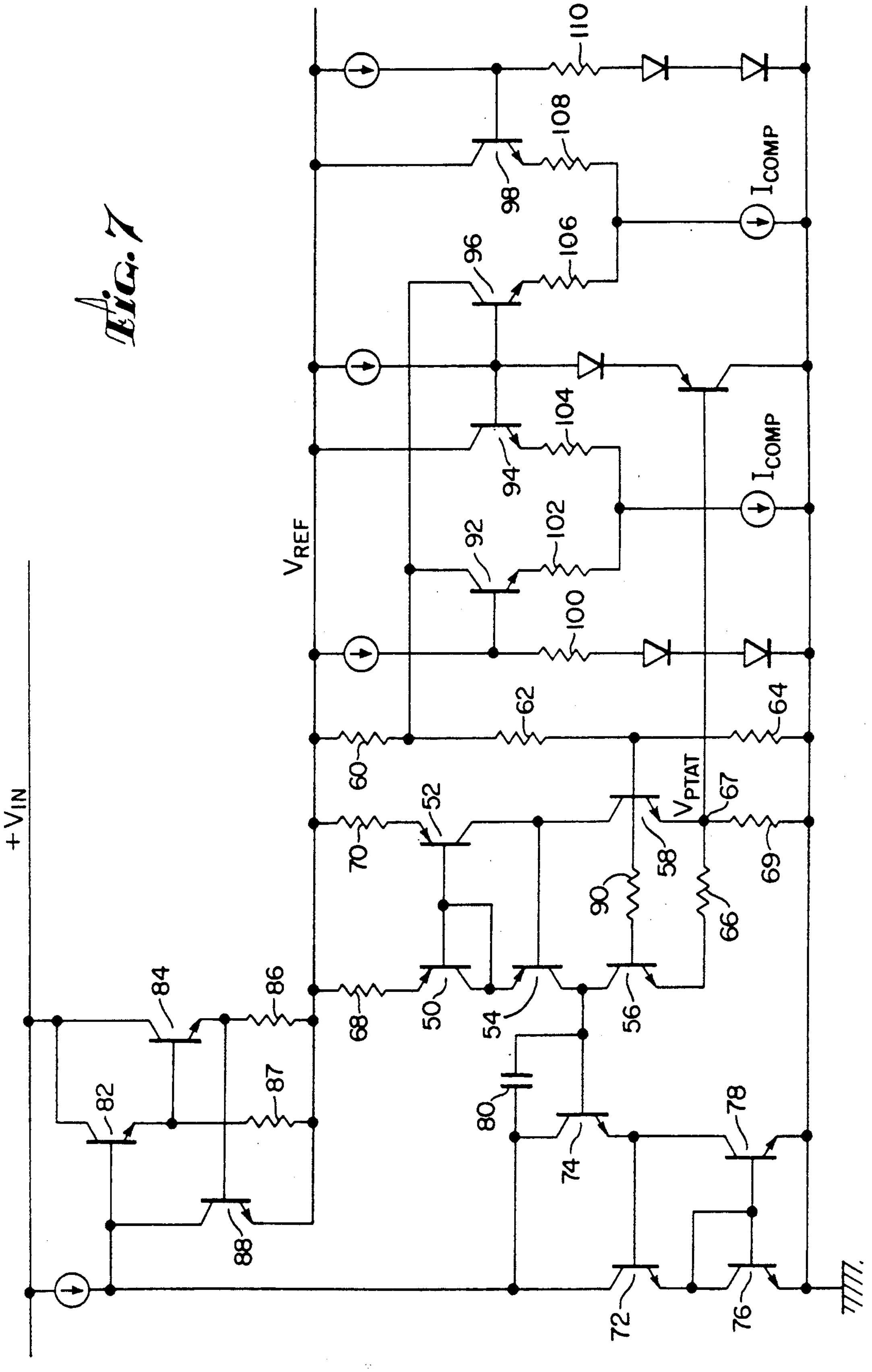
FIG. 7 is a schematic drawing of a detailed implementation of a curvature-corrected bandgap reference in accordance with the present invention.

Referring to FIG. 7, a specific embodiment of the present invention implementing a curvature-corrected bandgap reference is shown. The function of the active load circuit 12 shown in FIG. 4 is provided by PNP transistors 50, 52 and 54, which form a current mirror. This current mirror senses the difference of the collector currents of NPN transistors 56 and 58 which form the bandgap cell, corresponding to bandgap cell 10 of FIG. 4. In the bandgap cell formed by transistors 56 and 58, the emitter current density in transistor 58 is greater than that of transistor 56. The difference in the base-emitter voltages between the two transistors 56 and 58 appears across resistor 66.

The base-emitter voltage of transistor 58 has a negative temperature coefficient, and varies from approximately 828 mV at −55° C. to 480 mV at +125° C. Therefore, the voltage across resistor 69 must have a positive temperature coefficient; that is, the voltage at node 67 (corresponding to node 24 in FIG. 4) is $V_{PTAT}$ (voltage proportional to absolute temperature). $V_{PTAT}$ ranges from about 377 mV at −55° C. to about 727 mV at +125° C. This voltage $V_{PTAT}$ serves as the temperature sensing voltage at the temperature sense node for the curvature correction switches, as discussed earlier.

Output reference voltage $V_{REF}$ is divided down by a voltage divider network formed by resistors 60, 62 and 64. This reduced voltage is applied to the base of transistor 58. Resistor 60 in the resistor divider network corresponds to the compensation resistor 21 described in relation to FIG. 4. Thus after this output reference voltage is divided, the energy bandgap voltage appears at the base of the transistor 58 to minimize the temperature coefficient of the base-emitter voltage.

Resistors 68 and 70, connected to the active load, act as emitter-degeneration resistors which aid in minimizing voltage imbalance due to unmatched transistor parameters. The signal at the collector of transistor 56 is amplified and level-shifted up by transistors 72 and 74, which form a Darlington pair. Transistors 76 and 78 form a current mirror which controls the ratio of the currents flowing in the Darlington pair. This current mirror also provides a Darlington input voltage which is compatible with the voltage change at the collector of transistor 56. Resistor 90 minimizes error due to the base currents of transistors 56 and 58 flowing through divider resistors 60 and 62. Capacitor 80 provides single-pole frequency compensation for closed-loop stability. The voltage gain node at the collector of transistor 74 is buffered by a Darlington pair formed by transistors 82 and 84. Fault protection is provided by resistor 86 and transistor 88, which limit current. Resistor 87 improves the breakdown voltage of transistor 84.

Still referring to FIG. 7, transistors 92 and 94 form the low temperature correction switch. The temperature switching threshold is determined by the current flowing through resistor 100. Resistors 102 and 104 act as emitter-degeneration resistors to control the transconductance of the switch which, in turn, provides smooth, gradual correction of the low-temperature characteristic of the output reference voltage. Conversely, at high temperatures, transistors 96 and 98, and resistors 106, 108 and 110 provide the high-temperature correction of the temperature characteristic.

As noted above, the switching compensation achieved by the present invention is empirically derived and is generally set by the specific resistance values in the circuit which are chosen for a specific application and temperature range. The following values (in ohms) have been implemented in the circuit of FIG. 7 for a reference voltage of +5.10 volts and for a temperature range of from −55° C. to +125° C.

| | | | |
|---|---|---|---|
| Resistor 87: | 8.8K | Resistor 62: | 7920 |
| Resistor 86: | 13 | Resistor 64: | 3000 |
| Resistor 68: | 1280 | Resistor 100: | 12.7K |
| Resistor 70: | 1280 | Resistor 102: | 0 |
| Resistor 90: | 260 | Resistor 104: | 0 |
| Resistor 66: | 1000 | Resistor 106: | 0 |
| Resistor 69: | 6000 | Resistor 108: | 0 |
| Resistor 60: | 1110 | Resistor 110: | 19.3K |

(Although resistors 102–108 are zero for this application, they may be non-zero for other applications.) For this specific implementation, it is estimated that curvature correction will hold the temperature coefficient to ½% or better over the desired −55° C. to +125° C. mil. spec. temperature range.

Figure 8:
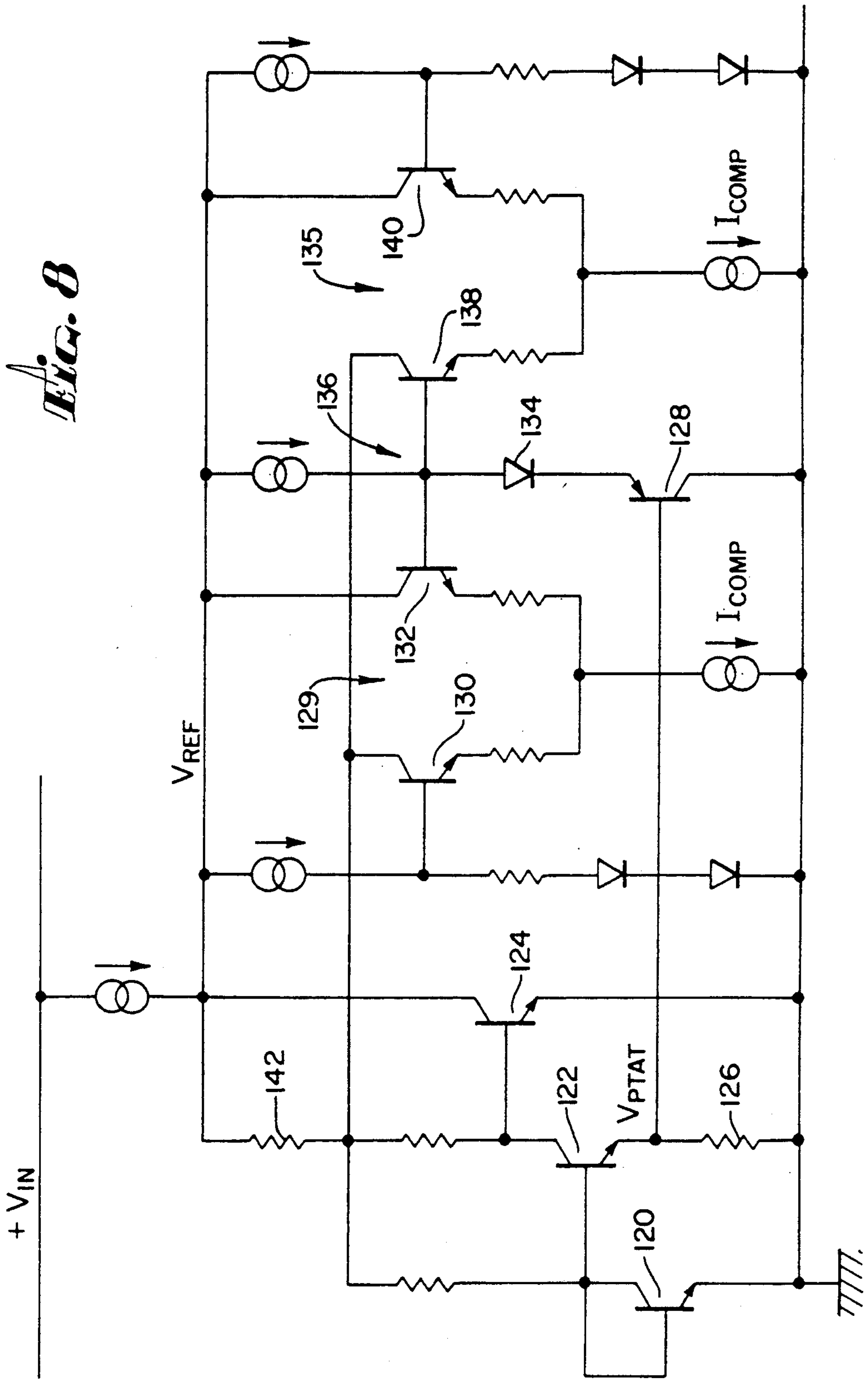
FIG. 8 is a schematic diagram showing an alternative embodiment of the bandgap reference circuit of the present invention employing a different type of bandgap reference cell.

Referring to FIG. 8, an alternative embodiment of the present invention, employing a three-transistor bandgap cell is shown. The bandgap cell is formed by transistors 120, 122 and 124. As in the earlier described embodiments, transistor 120 is operated at a higher emitter current density than transistor 122. The base-emitter voltage differential between the two transistors appears across resistor 126. This voltage differential $V_{PTAT}$ is level-shifted upward by transistor 128 and diode 134, and is connected to node 136 between transistors 132 and 138 as the input for the high and low-temperature compensation switches. Differential amplifier 129 employing transistors 130 and 132 forms the low-temperature switch, and differential amplifier 135 employing transistors 138 and 140 forms the high-temperature switch. The correction current from the collectors of transistors 130 and 138 flows through resistor 142, which generates a curvature-corrected output reference voltage to provide a linear temperature characteristic.

Two specific embodiments of the present invention have been described. Nevertheless, it will be understood that various other embodiments are within the scope of the present invention and that numerous modifications may be made without departing from the spirit and scope of the invention. In particular, various modifications may be made in the specific bandgap cell design and switching circuit design while remaining within the scope of the present invention. Also, the specific numerical values for the input and output voltages, temperature ranges, and specific circuit resistance values are purely for illustrative purposes and will vary with the specific implementation. Accordingly, it should be understood that the invention is not to be limited by the specific illustrated embodiments.

What is claimed is:

1. An improved voltage reference circuit, comprising:

means for establishing a reference voltage based on the bandgap of a semiconductor material;

voltage compensation means for adding a compensation voltage to said reference voltage;

means for sensing absolute temperature; and switching means, coupled to said sensing means, for switching on said compensation means in response to deviations from a nominal temperature.

2. An improved voltage reference circuit as set out in claim 1, wherein said means for establishing a reference voltage comprises:

a node for receiving an input voltage;

a first transistor and a second transistor operating at different emitter current densities and having their bases coupled; and means, coupled to said input voltage node, for sensing the collector currents of said first and second transistors and supplying current to said first and second transistors in response to said sensed collector currents.

3. An improved voltage reference circuit as set out in claim 1, wherein said voltage compensation means comprises a resistor and wherein said switching means switches variable current through said resistor in response to said temperature deviations.

4. An improved voltage reference circuit comprising:

means for establishing a reference voltage based on the bandgap of a semiconductor material;

voltage compensation means for adding a compensation voltage to said reference voltage, said compensation means comprising a resistor;

switching means, coupled to said sensing means, for switching on said compensation means in response to deviations from a nominal temperature and for switching variable current through said resistor in response to said temperature deviations, wherein said switching means comprises first and second differential amplifiers, each coupled to said means for sensing absolute temperature, which switch current through said resistor at high and low temperatures, respectively.

5. An improved voltage reference circuit as set out in claim 2, wherein said means for sensing absolute temperature comprises a circuit node having a voltage proportional to the difference between base-emitter voltages of said first and second transistors.

6. A voltage reference circuit for receiving an input voltage and providing an output reference voltage, comprising:

an input voltage node for receiving the input voltage;

a two-transistor bandgap reference cell including two bipolar transistors, each having a collector, base and emitter;

an output voltage node, coupled to said bandgap reference cell and said input voltage node, for supplying the output reference voltage;

a compensation resistance coupled through a divider network to the bases of the bandgap, transistors and to the output node; and temperature compensation means, connected to the compensation resistance, for stabilizing the output reference voltage by switching current through said compensation resistance in response to temperature deviations from a nominal temperature.

7. A voltage reference circuit as set out in claim 6, wherein the two transistors have coupled bases.

8. A voltage reference circuit as set out in claim 6, further comprising an active load attached to the collectors of the two transistors for sensing balanced collector currents in the two transistors.

9. A voltage reference circuit as set out in claim 8, wherein the active load is a current mirror circuit.

10. A voltage reference circuit for receiving an input voltage and providing an output reference voltage, comprising:

an input voltage node for receiving the input voltage;

a two-transistor bandgap reference cell including two bipolar transistors, each having a collector, base and emitter;

an output voltage node, coupled to said bandgap reference cell and said input voltage node, for supplying the output reference voltage;

a compensation resistance coupled through a divider network to the bases of the bandgap transistors and to the output node; and temperature compensation means, connected to the compensation resistance, for stabilizing the output reference voltage by switching current through said compensation resistance in response to temperature deviations from a nominal temperature, said temperature compensation means comprising a high-temperature current leg and a low-temperature current leg, wherein said high-temperature current leg switches increasing current through said compensation resistance as the temperature increases above said nominal temperature and wherein said low-temperature current leg switches increasing current through said compensation resistance as the temperature decreases below said nominal temperature.

11. An improved voltage reference circuit as set out in claim 10, wherein said low-temperature current leg comprises a first- current supply transistor, coupled to a supply voltage, said first current supply transistor receiving a voltage proportional to temperature at the base thereof, and a second current supply transistor coupled to said compensation resistance, said second current supply transistor having a low-temperature switching threshold voltage applied to the base thereof, and wherein said first and second current supply transistors are both coupled to a first constant current source.

12. An improved voltage reference circuit as set out in claim 10, wherein said high-temperature current leg comprises a third current supply transistor coupled to said compensation resistance, said third current supply transistor receiving a voltage proportional to temperature at the base thereof, and a fourth current supply transistor coupled to the supply voltage, said fourth current supply transistor having a high-temperature switching threshold voltage applied to the base thereof, and wherein said third and fourth current supply transistors are both coupled to a second constant current source.

13. A voltage reference circuit as set out in claim 6, wherein the transistors are NPN transistors.

14. A voltage reference circuit as set out in claim 6, wherein the transistors are PNP transistors.

15. A voltage reference circuit as set out in claim 7, wherein the transistors are formed of a semiconductor material and wherein the bandgap voltage of the semiconductor material is applied to the bases of the transistors.

16. A voltage reference circuit as set out in claim 5, wherein the transistors are fabricated in silicon, and wherein the output reference voltage is divided down through the compensation resistance and a resistor network to establish the bandgap voltage of silicon to appear at the common base connection.

17. A voltage reference circuit for receiving an input voltage and providing an output reference voltage, comprising:

an input voltage node for receiving the input voltage;

a three-transistor bandgap reference cell including three bipolar transistors, each having a collector, base and emitter, a first and second of the transistors having coupled bases;

an output voltage node, coupled to said bandgap reference cell and said input voltage node, for supplying the output reference voltage;

a compensation resistance coupled to the transistors and the output node; and temperature compensation means, connected to the compensation resistance, for stabilizing the output reference voltage by switching current through said compensation resistance in response to temperature deviations from a nominal temperature.

18. A voltage reference circuit as set out in claim 17, wherein said compensation resistance is coupled to the collectors of the first and second transistors and to the base of the third transistor.

19. A voltage reference circuit as set out in claim 17, wherein the transistors are NPN transistors.

20. A voltage reference circuit as set out in claim 17, wherein the transistors are PNP, transistors.

* * * * *

UNITED STATES PATENT AND TRADEMARK OFFICE

CERTIFICATE OF CORRECTION

PATENT NO. : 5,053,640

DATED : October 1, 1991

INVENTOR(S) : Daniel Yum

It is certified that error appears in the above-identified patent and that said Letters Patent is hereby corrected as shown below:

IN THE CLAIMS:

Claim 4, column 8, line 49, after "circuit", add --,--.

Col. 8, claim 4, between lines 54 and 55 add --means for sensing absolute temperature; and--.

Claim 6, column 9, line 14, after "bandgap", delete ",".

Claim 11, column 9, line 59, after "first", delete "-".

Claim 11, column 9, line 59, after "transistor", delete ",".

UNITED STATES PATENT AND TRADEMARK OFFICE

CERTIFICATE OF CORRECTION

PATENT NO. : 5,053,640

DATED : October 1, 1991

INVENTOR(S) : Daniel Yum

It is certified that error appears in the above-indentified patent and that said Letters Patent is hereby corrected as shown below:

Claim 20, column 10, line 60, after "PNP", delete ",".

Signed and Sealed this

Fourteenth Day of June, 1994

Attest:

BRUCE LEHMAN

*Attesting Officer* *Commissioner of Patents and Trademarks*